US010599566B2

(12) United States Patent
Adaikkalavan et al.

(10) Patent No.: US 10,599,566 B2
(45) Date of Patent: Mar. 24, 2020

(54) MULTI-MODE CACHE INVALIDATION

(71) Applicant: QUALCOMM Incorporated, San Diego, CA (US)

(72) Inventors: Ramasamy Adaikkalavan, Morrisville, NC (US); Harish Shankar, Raleigh, NC (US); Rajesh Kumar, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 118 days.

(21) Appl. No.: 15/647,202

(22) Filed: Jul. 11, 2017

(65) Prior Publication Data
US 2018/0150394 A1 May 31, 2018

Related U.S. Application Data

(60) Provisional application No. 62/427,774, filed on Nov. 29, 2016.

(51) Int. Cl.
| | |
|---|---|
| *G06F 12/0808* | (2016.01) |
| *G06F 16/903* | (2019.01) |
| *G11C 15/04* | (2006.01) |
| *G06F 12/0891* | (2016.01) |
| *G06F 12/1009* | (2016.01) |
| *G06F 12/1045* | (2016.01) |

(52) U.S. Cl.
CPC ...... *G06F 12/0808* (2013.01); *G06F 12/0891* (2013.01); *G06F 12/1009* (2013.01);
(Continued)

(58) Field of Classification Search
CPC .................................................. G06F 12/0895
(Continued)

(56) References Cited

U.S. PATENT DOCUMENTS 7,382,637 B1* 6/2008 Rathnavelu ............ G11C 15/00
365/189.05
7,620,778 B2* 11/2009 Mohammad ........ G06F 12/0864
711/144
(Continued)

FOREIGN PATENT DOCUMENTS

EP 1290562 A1 3/2003
WO 2013055831 A1 4/2013

OTHER PUBLICATIONS

International Search Report and Written Opinion—PCT/US2017/060111—ISA/EPO—dated Mar. 29, 2018.
(Continued)

*Primary Examiner* — Min Huang
(74) *Attorney, Agent, or Firm* — MG-IP Law, P.C.

(57) ABSTRACT

Systems and methods for cache invalidation, with support for different modes of cache invalidation include receiving a matchline signal, wherein the matchline signal indicates whether there is a match between a search word and an entry of a tag array of the cache. The matchline signal is latched in a latch controlled by a function of a single bit mismatch clock, wherein a rising edge of the single bit mismatch clock is based on delay for determining a single bit mismatch between the search word and the entry of the tag array. An invalidate signal for invalidating a cacheline corresponding to the entry of the tag array is generated at an output of the latch. Circuit complexity is reduced by gating a search word with a search-invalidate signal, such that the gated search word corresponds to the search word for a search-invalidate and to zero for a Flash-invalidate.

20 Claims, 7 Drawing Sheets

(52) U.S. Cl.
CPC .... *G06F 12/1045* (2013.01); *G06F 16/90339* (2019.01); *G11C 15/04* (2013.01); *G06F 2212/621* (2013.01); *G06F 2212/65* (2013.01); *G06F 2212/68* (2013.01)

(58) Field of Classification Search
USPC .......................................................... 711/144
See application file for complete search history.

(56) References Cited

U.S. PATENT DOCUMENTS

| | | | | |
|---|---|---|---|---|
| 7,650,465 | B2* | 1/2010 | Knoth | G06F 9/30043 |
| | | | | 711/128 |
| 8,156,357 | B2 | 4/2012 | Zhang et al. | |
| 8,576,599 | B2 | 11/2013 | Atwal et al. | |
| 9,396,794 | B1* | 7/2016 | Nadkarni | G11C 15/04 |
| 2003/0233011 | A1* | 12/2003 | Fagan | C07C 67/04 |
| | | | | 560/174 |
| 2006/0242448 | A1* | 10/2006 | Minzoni | G06F 1/10 |
| | | | | 713/503 |
| 2013/0091325 | A1* | 4/2013 | Varma | G11C 15/04 |
| | | | | 711/108 |
| 2013/0339597 | A1* | 12/2013 | Varma | G11C 15/04 |
| | | | | 711/108 |
| 2017/0039138 | A1* | 2/2017 | Toda | G06F 12/0842 |

OTHER PUBLICATIONS

Partial International Search Report—PCT/US2017/060111—ISA/EPO—dated Feb. 7, 2018.

* cited by examiner

MULTI-MODE CACHE INVALIDATION

CLAIM OF PRIORITY UNDER 35 U.S.C. § 119

The present Application for Patent claims the benefit of Provisional Patent Application No. 62/427,774 entitled "MULTI-MODE CACHE INVALIDATION" filed Nov. 29, 2016, and assigned to the assignee hereof and hereby expressly incorporated herein by reference in its entirety.

FIELD OF DISCLOSURE

Disclosed aspects are generally directed to processing systems. More specifically, exemplary aspects are directed to circuits for multiple modes of invalidation of a cache in a processing system.

BACKGROUND

In advanced processing systems such as multi-processor systems, a cache, such as an instruction cache (I-cache or I$) may be shared across two or more processors. Similarly, a memory management unit (MMU) comprising a translation lookaside buffer (TLB) for quick translation of virtual-to-physical addresses cached in the TLB may also be shared across two or more processors. In prior implementations, invalidation of the cache or the TLB involved invalidating all cachelines or all TLB entries, respectively, even if a more precise invalidation of a subset of cachelines or TLB entries would have been sufficient. This is because invalidation techniques such as Flash-invalidate which invalidate the entire cache or TLB were easier to implement.

However, with advances in multi-processor technologies wherein a growing number of processors and operating modes are supported, there is an increasing need for precise invalidation techniques. For example, if the entire I-cache is to be invalidated every time there is a context change which changes the mappings of virtual-to-physical addresses of only a subset of the TLB entries, this may lead to severe performance degradation which would be unacceptable in the advanced multi-processors. Thus, in emerging designs wherein the I-cache is made inclusive of the TLB, the TLB may be used to filter invalidates to the I-cache, which lends support for precise invalidation of one or more cachelines (e.g., cachelines tagged with TLB entries to be invalidated). Several other modes of precise invalidation are also desirable, such as support for precise invalidation of all cachelines of a set in a set-associative cache, precise invalidation based on a TLB tag, or combinations thereof.

However, designing circuits for precise invalidation in the various above-mentioned modes continues to be challenging. Some of these challenges can be understood, for example by considering a conventional implementation of a cache with a tag array and a data array. The tag array holds a subset of an address corresponding to cachelines which are stored in the data array. Searching for a cacheline using a search address involves determining whether there is a matching tag, and if there is (referred to as a cache hit), a corresponding cacheline from the data array is accessed. The tag array may be designed as a content-addressable-memory (CAM). In a dynamic logic implementation, each tag array entry has a matchline, and all matchlines are initially precharged to a high state or logic "1". If there is a hit for a particular tag array entry, the matchlines for the matching entry remains in its native precharge state while the matchlines for the remaining mismatching entries are discharged to a low state or logic "0". For each tag array entry, a signal referred to as a match clock indicates whether a matchline for the tag array entry is high (due to a match or hit) or low (due to a mismatch or miss) during a clock cycle in which the tag array is searched. If the matchline is high (e.g., the matchline of a hitting tag array entry), the cacheline corresponding to the hitting tag array entry is invalidated. In practice, the invalidation may involve asserting an invalidation signal which will cause a valid bit in the data array (which is associated with the hitting tag array entry) to flip.

The above operation may suffer from the following drawbacks. An objective of the invalidation circuit is to ensure that the rising edge of the match clock is late enough to allow matchlines of all mismatching entries to discharge, even single bit mismatches (i.e., the search address and the tag array entry mismatch by a single bit), which are the weakest in discharging the matchlines and thus, the slowest arriving signals. With respect to the falling edge of the match clock, another objective of the invalidation circuit is to ensure that the match clock falls before the next clock cycle, because in the next clock cycle all the matchlines will be returned to the precharge state, including the mismatching entries, and so the information of which matchlines indicated a hit will be lost.

In an effort to achieve both of the above objectives, conventional implementations attempt to meet the timing requirements or timing margins on both the rising and falling edge of the match clock by using a narrow match clock pulse. However, a narrow match clock pulse may not be sufficient to generate the invalidate signal which will invalidate the targeted cacheline (i.e., write or flip the corresponding valid bit). This problem can be exacerbated with dynamic voltage and frequency scaling (DVFS) efforts for lowering operating voltage and correspondingly, operating frequency of the circuits, for reducing power consumption. This is because at lower voltages, the pulse width of the write clock may need to be even wider in order to achieve the invalidation of the targeted cacheline.

Accordingly it is seen that there is a need for addressing the challenges involved in supporting the various invalidation modes for caches while meeting timing margins and overcoming the aforementioned challenges faced by conventional implementations.

SUMMARY

Exemplary aspects of the invention are directed to systems and method for cache invalidation, with support for different modes of cache invalidation.

For example, in one aspect, a method of cache invalidation of one or more cachelines is implemented by decoupling a matchline signal from an invalidate signal. The method comprises receiving a matchline signal, wherein the matchline signal indicates whether there is a match between a search word and an entry of a tag array of the cache. The matchline signal is latched in a latch controlled by latch clock which is a function of a single bit mismatch clock, wherein a rising edge of the single bit mismatch clock is based on delay for determining a single bit mismatch between the search word and the entry of the tag array. An invalidate signal for invalidating a cacheline corresponding to the entry of the tag array is generated at an output of the latch. Accordingly, the invalidate signal is decoupled from the matchline signal for improved timing margins for invalidate operations.

In another aspect of reducing the complexity of invalidation circuitry for a cache, a method of invalidating a cache includes gating a search word with a search-invalidate signal to generate a gated search word. The gated search word comprises true and complement values corresponding to the search word for a search-invalidate operation and the gated search word comprises both true and complement values set to zero for a Flash-invalidate operation. A matchline is generated based on a comparison of the gated search word with an entry of a tag array, wherein the matchline indicates a match (high for a hit, low for a miss) for the search-invalidate operation and the matchline remains high for the Flash-invalidate operation. An invalidate signal for invalidating a corresponding cacheline is generated based on the matchline. The invalidate signals for all cachelines are high for the Flash-invalidate operation.

Another exemplary aspect is directed to an apparatus comprising a cache comprising a tag array and a data array, and an invalidation circuit configured to receive a matchline signal, wherein the matchline signal indicates whether there is a match between a search word and an entry of the tag array. The apparatus further comprises a latch circuit configured to latch the matchline signal and output an invalidate signal, wherein the latch circuit is controlled by a latch clock, wherein the latch clock is a function of a single bit mismatch clock, wherein a rising edge of the single bit mismatch clock is based on delay for determining a single bit mismatch between the search word and the entry of the tag array.

Yet another exemplary aspect is directed to an apparatus comprising a cache comprising a data array and a tag array and a clock gating circuit configured to gate a search word with a search-invalidate signal to generate a gated search word, wherein the gated search word comprises true and complement values corresponding to the search word for a search-invalidate operation and wherein the gated search word comprises both true and complement values set to zero for a Flash-invalidate operation. The apparatus further comprises a matchline generation circuit configured to generate a matchline based on a comparison of the gated search word with an entry of a tag array, wherein the matchline indicates a match for the search-invalidate operation, and wherein the matchline remains high for the Flash-invalidate operation, and an invalidation circuit configured to generate an invalidate signal based on the matchline.

BRIEF DESCRIPTION OF THE DRAWINGS

The accompanying drawings are presented to aid in the description of aspects of the invention and are provided solely for illustration of the aspects and not limitation thereof.

DETAILED DESCRIPTION

Figure 1:
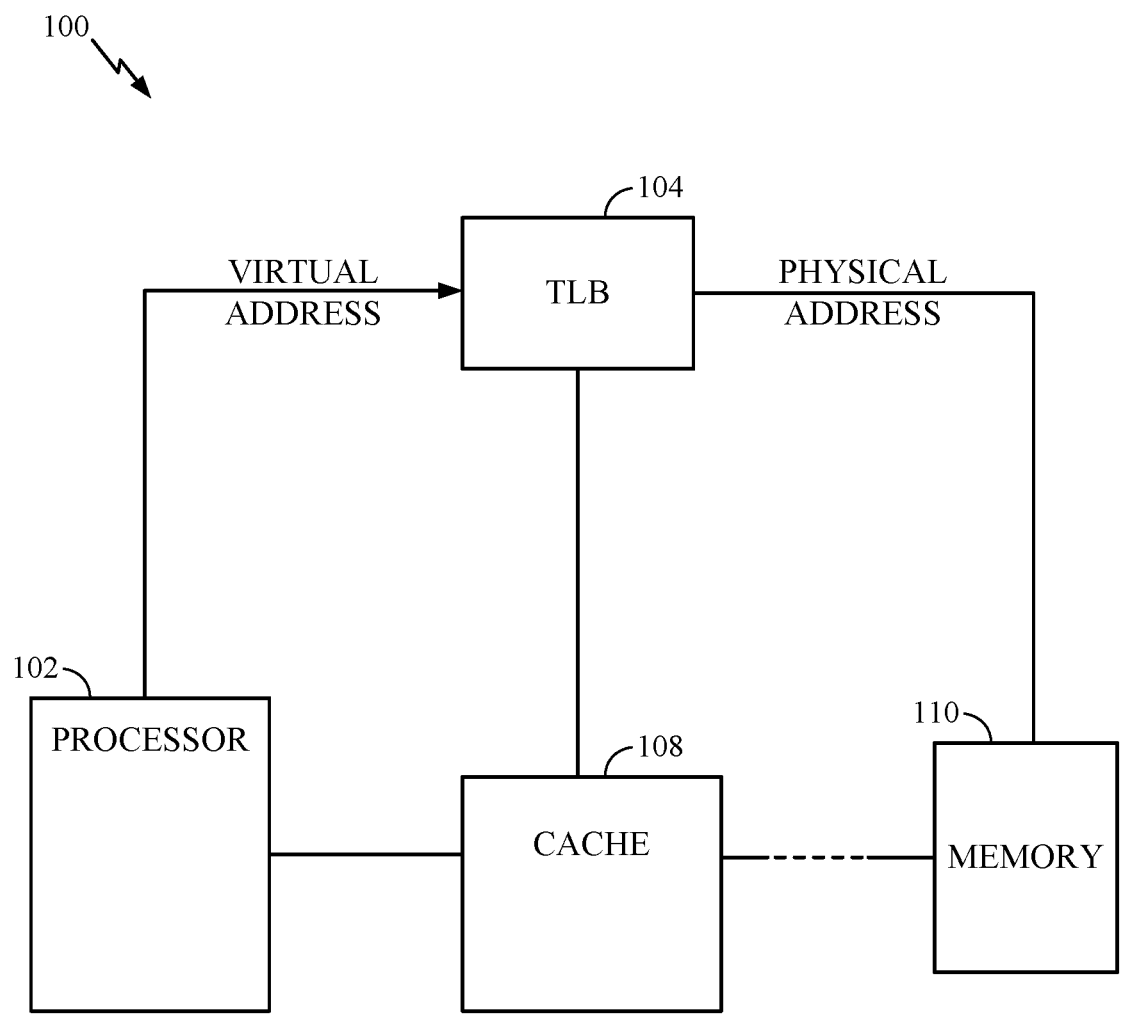
FIG. 1 illustrates a processing system configured according to exemplary aspects of this disclosure.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to circuits and associated techniques for cache invalidation, with support for different modes of cache invalidation. For example, in one aspect, precise cache invalidation of one or more cachelines is implemented by decoupling the aforementioned matchline signal from an invalidate signal, e.g., with a latch. For example, for each tag array entry, a matchline signal may be generated based on comparison of the tag array entry with a search address (or subset thereof). The matchline signal for each wordline may be latched using an exemplary latch clock. The latch clock may be based on (e.g., a stretched and delayed version of) a single bit mismatch clock for the tag array entry. The single bit mismatch clock samples each matchline signal and remains high for matchline signals which match and goes low for matchline signals which mismatch, and has a delay corresponding to a mismatch of a single bit. With this configuration, an invalidate signal for invalidating each corresponding wordline may be decoupled from the matchline and have its timing margins based on the latch clock (also referred to as an invalidate wordline clock in the following description). In this manner, timing restrictions on a match clock used to sample the matchline in conventional implementations discussed above may be overcome.

Yet another aspect of this disclosure pertains to reducing the circuitry involved in supporting multiple modes of invalidations for a wordline. In an example case, clock gating circuits are provided to generate the match clock based on a logical combination (e.g., "OR") of the different invalidate modes, e.g., search-invalidate, Flash-invalidate, etc., rather than implement the logical combination of the modes at each wordline of the data array.

With reference now to FIG. 1, an example processing system 100 in which aspects of this disclosure may be deployed, is illustrated. Processing system 100 may comprise processor 102, which may be a central processing unit (CPU) or any processor core in general. Processor 102 may be configured to execute programs, software, etc., which may reference virtual addresses. Processor 102 may be coupled to one or more caches, of which cache 108, is representatively shown. Cache 108 may be an instruction cache, a data cache, or a combination thereof. In one example, cache 108 may be configured as a cache which may be accessed by processor 102 using virtual addresses. Cache 108, as well as one or more backing caches which may be present (but not explicitly shown) may be in communication with a main memory such as memory 110. Memory 110 may comprise physical memory in a physical address space and a memory management unit comprising TLB 104 may be used to obtain translations of virtual addresses (e.g., from processor 102) to physical addresses for ultimately accessing memory 110. Although memory 110 may be shared amongst one or more other processors or processing elements, these have not been illustrated, for the sake of simplicity.

Figure 2A:
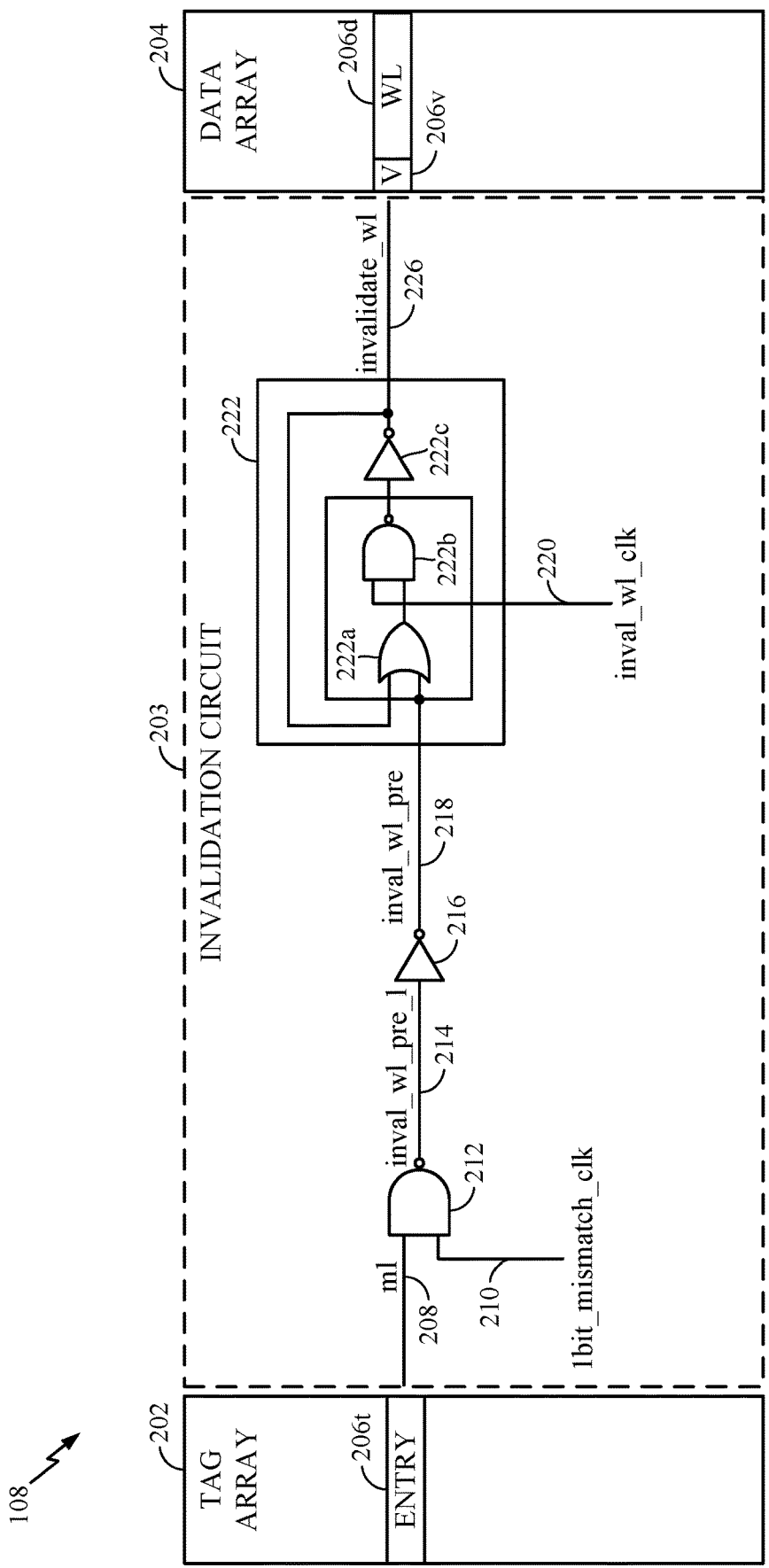
FIG. 2A illustrates an exemplary configuration of a cache with an invalidation circuit according to aspects of this disclosure.

With reference now to FIG. 2A, an exemplary circuit for invalidation of cache 108 is illustrated. Although not discussed in detail in this disclosure, a similar circuit may be configured for invalidation of other caches (not explicitly shown) or other structures such as TLB 104 of processing system 100 without departing from the scope of this disclosure. In FIG. 2, cache 108 is shown as comprising tag array 202, data array 204 and exemplary invalidation circuit 203. Cache 108 may be organized as a set-associative cache as known in the art.

When processor 102 makes a request for accessing cache 108 (e.g., for a read or a write), a portion of the address associated with the request may be used for indexing a particular entry, e.g., tag array entry 206t of tag array 202 and another portion of the address, referred to herein as a search word, may be compared with the value of tag array entry 206t. If there is a match or hit for tag array entry 206t, then matchline (ml) 208 is asserted (or in a dynamic logic implementation, remains precharged during a search clock cycle) and if there a miss, then matchline 208 is deasserted (or discharged during the clock cycle in the dynamic logic implementation). Data array 204 comprises cachelines that may be accessed by activating corresponding wordlines, and if there is a hit for tag array entry 206t, wordline 206d may be activated (e.g., for a read or a write) and in further aspects, if a corresponding valid bit (v) 206v is set.

In the event of an invalidation operation, e.g., a search-invalidate (i.e., if a particular address hits in cache 108, the corresponding cacheline is invalidated) if matchline 208 is asserted based on a match for tag array entry 206t, then an entry corresponding wordline 206d is to be invalidated, e.g., by flipping or setting valid bit 206v to invalid or "0". If there is a miss for tag array entry 206t, then the invalidate operation is not performed. Since whether or not an invalidation is to be performed is based on whether or not there was a match or a mismatch and since single bit mismatch case involves the maximum delay in detecting a match/mismatch, the invalidation operation is performed using invalidate_wl 226, which is a signal that is decoupled from matchline 208 in invalidation circuit 203 as follows.

Invalidation circuit 203 is configured to support search-invalidate operations across various process-voltage-temperature corners (e.g., shrinking operating voltage/frequency due to DVFS scaling), as well as invalidate operations in various other modes, such as invalidate-by-set (e.g., wherein an entire set to which tag array entry 206t belongs is invalidated); invalidate-by-TLB-tag (e.g., wherein wordline 206d is invalidated if in addition to a matching tag array entry 206t, a match is also found for a tag corresponding to a TLB entry of TLB 104 which comprises a translation for the search address); or combinations thereof, such as an invalidate-all (e.g., Flash-invalidate), invalidate-by-set-and-TLB-tag, etc.

In one aspect, matchline 208 is one input to NAND gate 212, with another input to NAND gate 212 supplied by 1bit_mismatch_clk 210, wherein 1bit_mismatch_clk 210 is a clock which samples matchline 208 to detect if the search word and tag array entry 206t mismatch by a single bit. In a dynamic logic implementation, the single bit mismatch is the most delayed condition which would pull down or discharge matchline 208, and as such 1bit_mismatch_clk 210 samples a late arriving discharge of matchline 208 for the single bit mismatch case. The output inval_wl_pre_1 214 of NAND gate 212 is pulled to "0" when 1bit_mismatch_clk 210 is "1" and matchline 208 is high, but otherwise stays at "1". The output inval_wl_pre_1 214 of NAND gate 212 is inverted by inverter 216 to generate inval_wl_pre 218, which is the inverse of inval_wl_pre_1 214. The signal inval_wl_pre 218 is one input to latch 222 formed by OR gate 222a, NAND gate 222b and inverter 222c. Latch 222 is controlled by the latch clock shown as inval_wl_clk 220, which is a logical equivalent to 1bit_mismatch_clk 210, but may be a delayed and stretched version of 1bit_mismatch_clk 210 (e.g., in case there is voltage scaling and latch 222 is operated at a lower voltage domain).

Operationally, 1bit_mismatch_clk 210 samples matchline 208 for each tag array entry 206t. In the process of the sampling, as noted above, 1bit_mismatch_clk 210 goes high for all tag array entries and falls for mismatching entries, with 1bit_mismatch_clk 210 for single bit mismatch entries falling the last. Using inval_wl_clk 220 which is effectively 1bit_mismatch_clk 210, as the latch clock, latch 222 latches a high value on matchline 208, which is output as a high value on invalidate_wl 226 if the late arriving 1bit_mismatch_clk 210 does not go low. In an implementation, the latched output invalidate_wl 226 is used as an invalidation signal for invalidating wordline 206d, wherein invalidate_wl 226 has a rising edge which is controlled by inval_wl_clk 220.

Unlike the traditional implementation wherein an invalidation signal directly derived from a match clock would need to fall before the next clock cycle, invalidate_wl 226 does not have such timing restrictions and may remain high even after matchline 208 falls. Accordingly, the falling edge of invalidate_wl 226 can occur after the falling edge of matchline 208 (once again, before the next clock cycle commences, all matchlines including matchline 208 are returned to the precharge state). The falling edge of invalidate_wl 226 is controlled by inval_wl_clk 220 or 1bit_mismatch_clk 210, decoupled from matchline 208 as explained above.

Figure 2B:
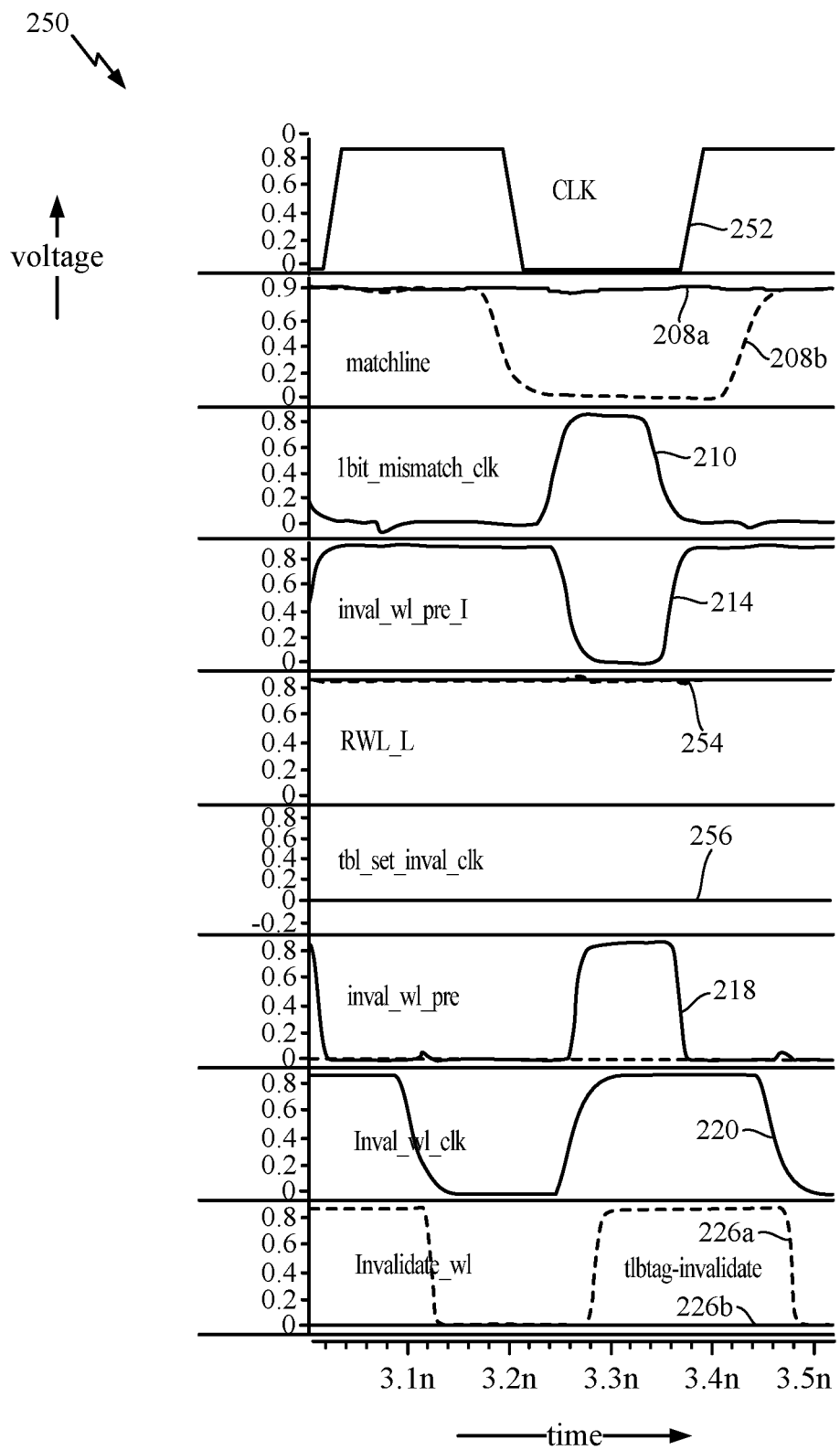
FIG. 2B illustrates waveforms of signals associated with the exemplary cache configuration shown in FIG. 2A.

FIG. 2B shows example waveforms for the signals shown in FIG. 2A. In FIG. 2B, the invalidate signals for the various operating modes such as TLB_tag_invalidate 250 (to invalidate based on a TLB tag), TLB_set_inval_clk 256 (to invalidate an entire cache set based on a TLB invalidate), etc., are also shown. The signal RWL_L 254 being high indicates that the operation is not for a read, but rather is for an invalidation. The operation of invalidate circuit 203 may be based on clock 252. For the sake of illustration, two matchlines are shown, wherein matchline 208a corresponds to an example tag array entry 0 which is assumed to have a hit and matchline 208b corresponds to another example tag array entry 63 which is assumed to mismatch (or result in a miss for a search word). Correspondingly, hitting matchline 208a remains at a high or precharged state and missing/mismatching matchline 208b falls to a low or discharged state. In order to capture a late fall of matchline 208b for the case of a single bit mismatch, 1bit_mismatch_clk 210 is provided with a rising edge with an expected time delay for a single bit mismatch after the matchlines evaluate.

For a search-invalidate, invalidate_wl 226a for tag array entry 0, corresponding to hitting matchline 208a is to remain high (to effect an invalidate operation on a corresponding wordline 0 or data array 204); and invalidate_wl 226b for tag array entry 63, corresponding to missing matchline 208b is to remain low (since an invalidate operation is not to be performed on a corresponding wordline 63 or data array 204).

The signals inval_wl_pre_l 214 and inval_wl_pre 218 evaluate based on 1bit_mismatch_clk 210 and the corresponding values of matchlines 208a-b. The latch clock inval_wl_clk 220 is shown as a delayed and stretched version of 1bit_mismatch_clk 210 and is used to control latch 222 respectively for generating corresponding invalidate_wl 226a and 226b. As shown, invalidate_wl 226a for hitting matchline 208a rises and falls based on inval_wl_clk 220, decoupled from matchline 208a; and invalidate_wl 226b for missing matchline 208b remains low. It is also noted that invalidate_wl 226 is a wide signal which can remain high past the falling edge of clock 252 and thus provides sufficient margins for flipping or writing valid bit 206v of wordline 0. Thus, a decoupled operation of the invalidate is achieved without being restricted by the traditional tight timing margins for a match clock.

Figure 3A:
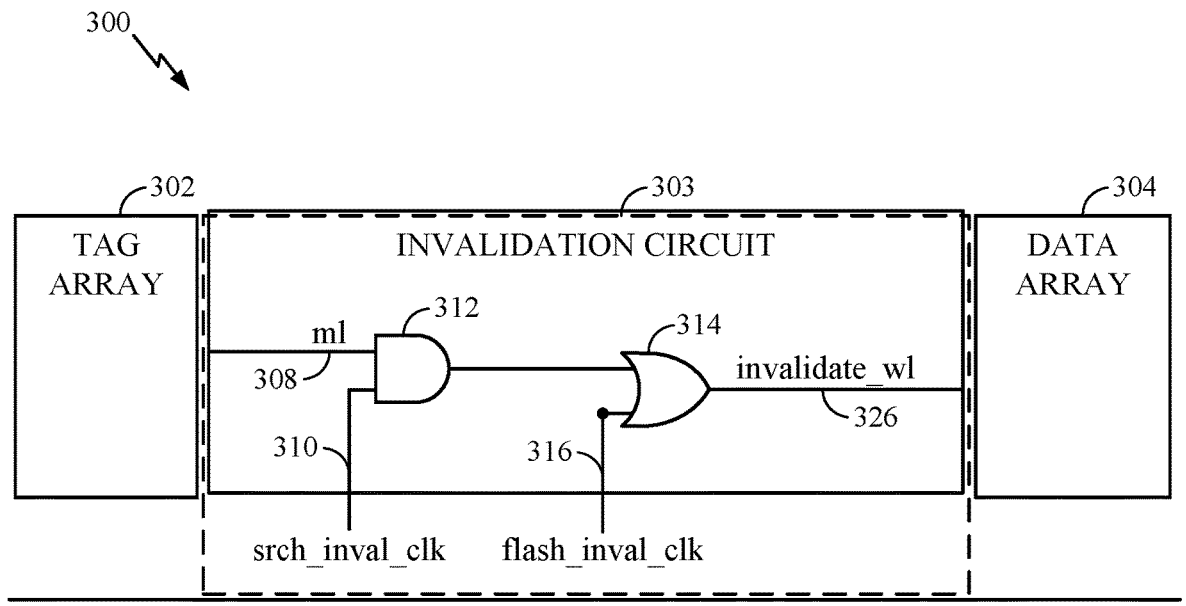
FIG. 3A illustrates a conventional implementation of a cache.
Figure 3B:
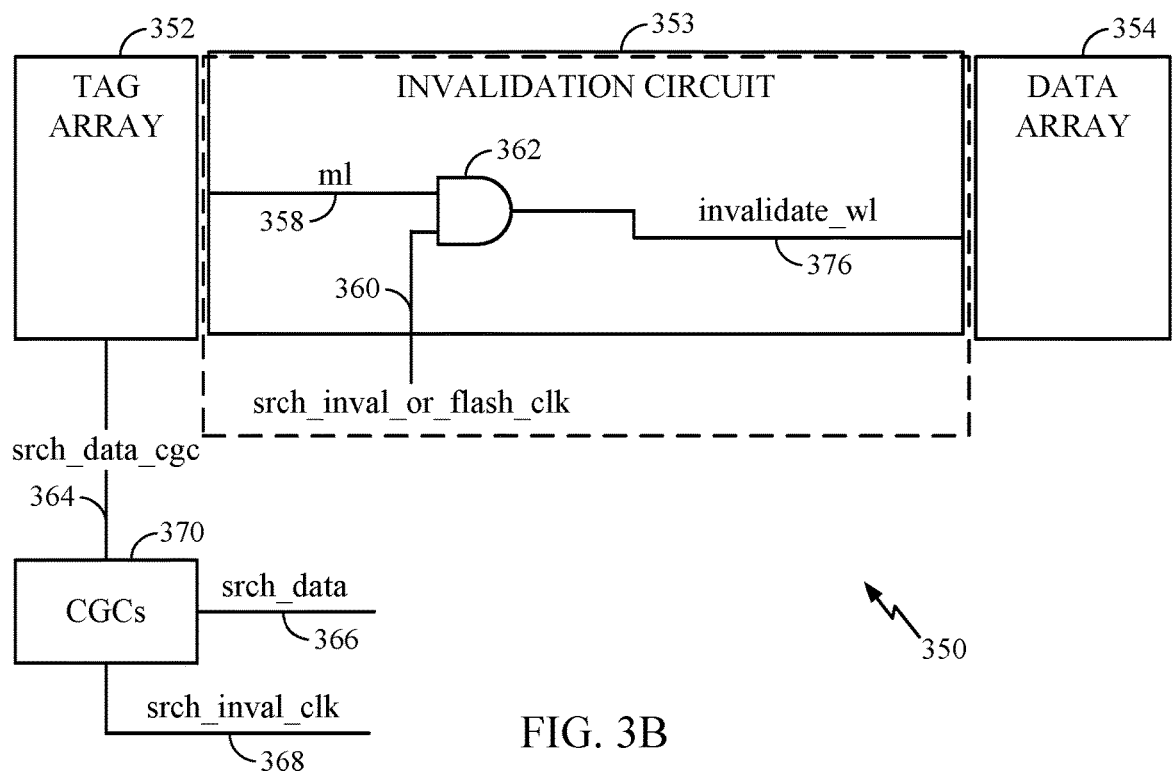
FIG. 3B illustrates an exemplary cache configured according to aspects of this disclosure.

With reference now to FIGS. 3A-B, aspects related to reducing the circuitry in cache invalidation will be explained. FIG. 3A shows a conventional implementation of invalidation circuitry 303 used in a conventional cache 300. In FIG. 3A, tag array 302 and data array 304 may have similar functions as explained previously with reference to FIG. 2. In FIG. 3A, matchline 308 may be asserted or deasserted for a particular tag array entry based on whether or not a search word matches or mismatches, respectively. A search-invalidate is controlled by srch_inval_clk 310, such that when matchline 308 is asserted for a hitting tag array entry and srch_inval_clk 310 is high, the output of AND gate 312 is high. OR gate 314 selects between the output of AND gate 312 and flash_inval_clk 316, which is used for invalidation of all cachelines of data array 304. Thus, when flash_inval_clk 316 is high OR (implemented in OR gate 314) the output of AND gate 312 is high (when matchline 308 is high and srch_inval_clk 310) is high, invalidate_wl 326 is high and a corresponding entry (in the case of a Flash-invalidate, all entries) of data array 304 is invalidated (e.g., by resetting to zero a valid bit, not explicitly shown in this illustration).

It is observed that in the conventional implementation of cache 300, for the search-invalidate, the search word is searched against all entries or all sets of tag array 302 and if there is a match for that set or entry, it is invalidated; and for the Flash-invalidate, all sets are invalidated using the additional OR circuitry for each cacheline. This additional OR circuit implementation for each cacheline consumes significant logic and associated power. This problem is exacerbated when additional invalidation modes are to be supported (e.g., additional OR gates may be added).

In FIG. 3B, the OR functionality of OR gate 314, for example, is simplified, thus reducing the circuit complexity of the exemplary implementation of an example cache 350. In FIG. 3B, tag array 352, invalidation circuit 353, and data array 354 are shown. Also shown are clock-gating circuits (CGCs) 370. The search word is provided as one input, search_data 366 to CGCs 370 with another input provided by srch_inval_clk 368. Search_data 366 is clock gated by srch_inval_clk 368 and the gated search data is provided on the output of CGCs 370 shown as srch_data_cgc 364. For a search-invalidate operation, srch_inval_clk 368 will be high and for a Flash-invalidate operation, srch_inval_clk 368 will be low. When srch_inval_clk 368 is high, the srch_data_cgc 364 would correspond to search_data 366. A search will proceed normally in tag array 352 and the match clock would be provided on srch_inval_or_flash_clk 360 (which will be high for search-invalidate) to generate matchline 358 (a matchline generation circuit, not separately labeled may generate matchline 358 as above). If matchline 358 is "1", the output of AND gate 362 will cause invalidate_wl 376 to be high, which will be used to invalidate a corresponding cacheline in data array 354.

However, when srch_inval_clk 368 is low, e.g., in the case of a Flash-invalidate, CGCs 370 will gate the output, srch_data_cgc 364 to be all zero. More specifically, a dynamic logic implementation, both true and complement values of srch_data_cgc 364 will be zero, which is not typical for an evaluation of a traditional search where true and complement values of srch_data_cgc 364 will have complementary values of (0, 1) or (1,0). Regardless of the complementary values which are held in tag array entries, e.g., in a content addressable memory (CAM) implementation of tag array 352, the (0,0) configuration of the true and complement values of srch_data_cgc 364 both being set to zero will mean that none of the matchlines 358 of tag array 352 can be pulled low. Thus, all matchlines of all sets or tag array entries will remain high; the match clock would be provided on srch_inval_or_flash_clk 360 will also be a "1" since Flash-invalidate is asserted, causing invalidate_wl 376 for all cachelines to be asserted, thus invalidating all cachelines of data array 354.

Thus, an existing search-invalidate circuitry can be substantially reused for a Flash-invalidate in the exemplary implementation of cache 350 without expending additional circuitry such as the OR gates 314 shown in FIG. 3A for a Flash-invalidate. Similar techniques may also be implemented for a set-invalidate where tag array 352 supports a search-set-invalidate option.

Figure 4A:
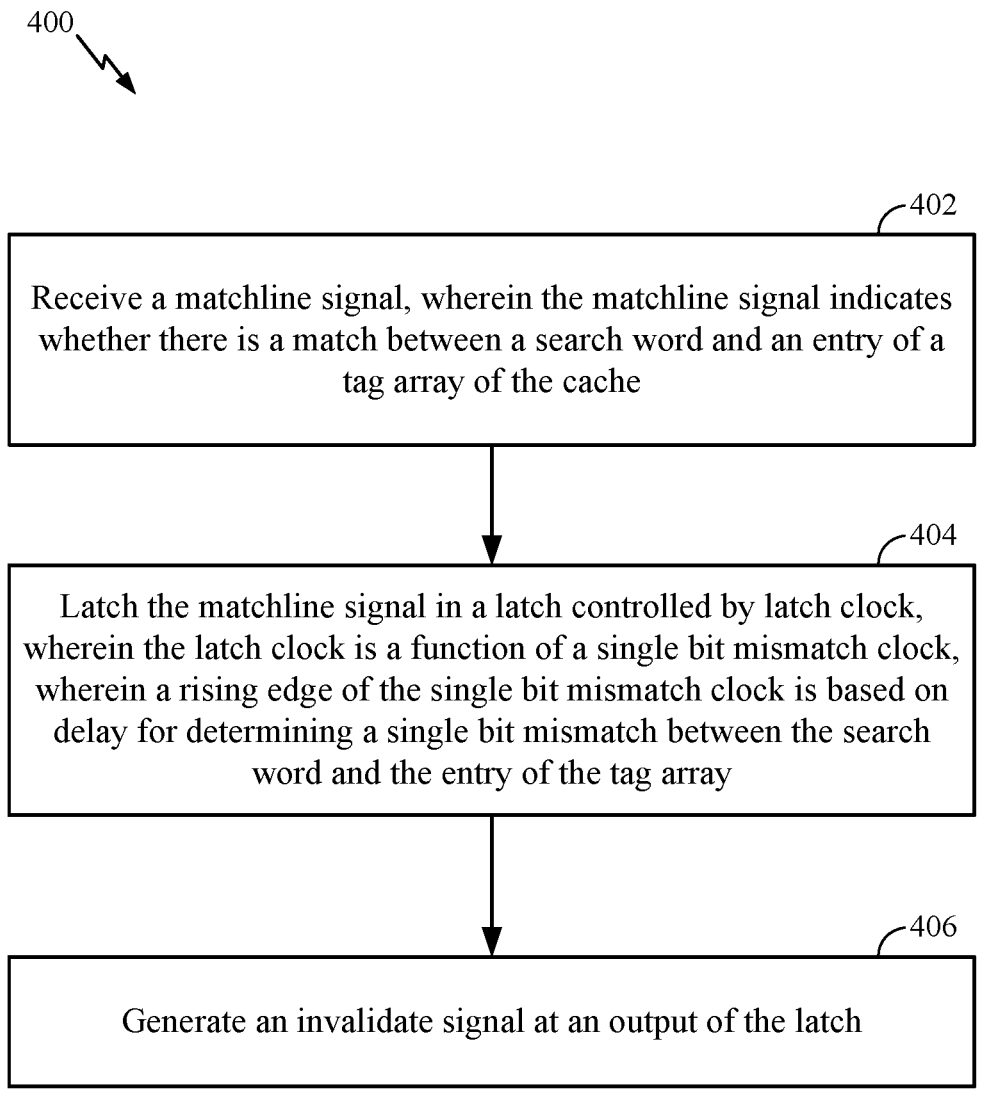
FIGS. 4A-B illustrate flow-charts pertaining to exemplary cache invalidation methods, according to aspects of this disclosure.

It will be appreciated that aspects include various methods for performing the processes, functions and/or algorithms disclosed herein. For example, as illustrated in FIG. 4A, an aspect can include a method (400) of cache invalidation.

Block 402 comprises receiving a matchline signal (e.g., matchline 208), wherein the matchline signal indicates whether there is a match between a search word and an entry of a tag array (e.g., 206t) of the cache;

Block 404 comprises latching the matchline signal (e.g., inval_wl_pre 218 derived from matchline signal 208) in a latch (e.g., 222) controlled by latch clock (inval_wl_clk 220), wherein the latch clock is a function of a single bit mismatch clock (e.g., inval_wl_clk 220 is a delayed and stretched version of 1bit_mismatch_clk 210), wherein a rising edge of the single bit mismatch clock is based on delay for determining a single bit mismatch between the search word and the entry of the tag array; and Block 406 comprises generating an invalidate signal (e.g., invalidate_wl 226) at an output of the latch.

Figure 4B:
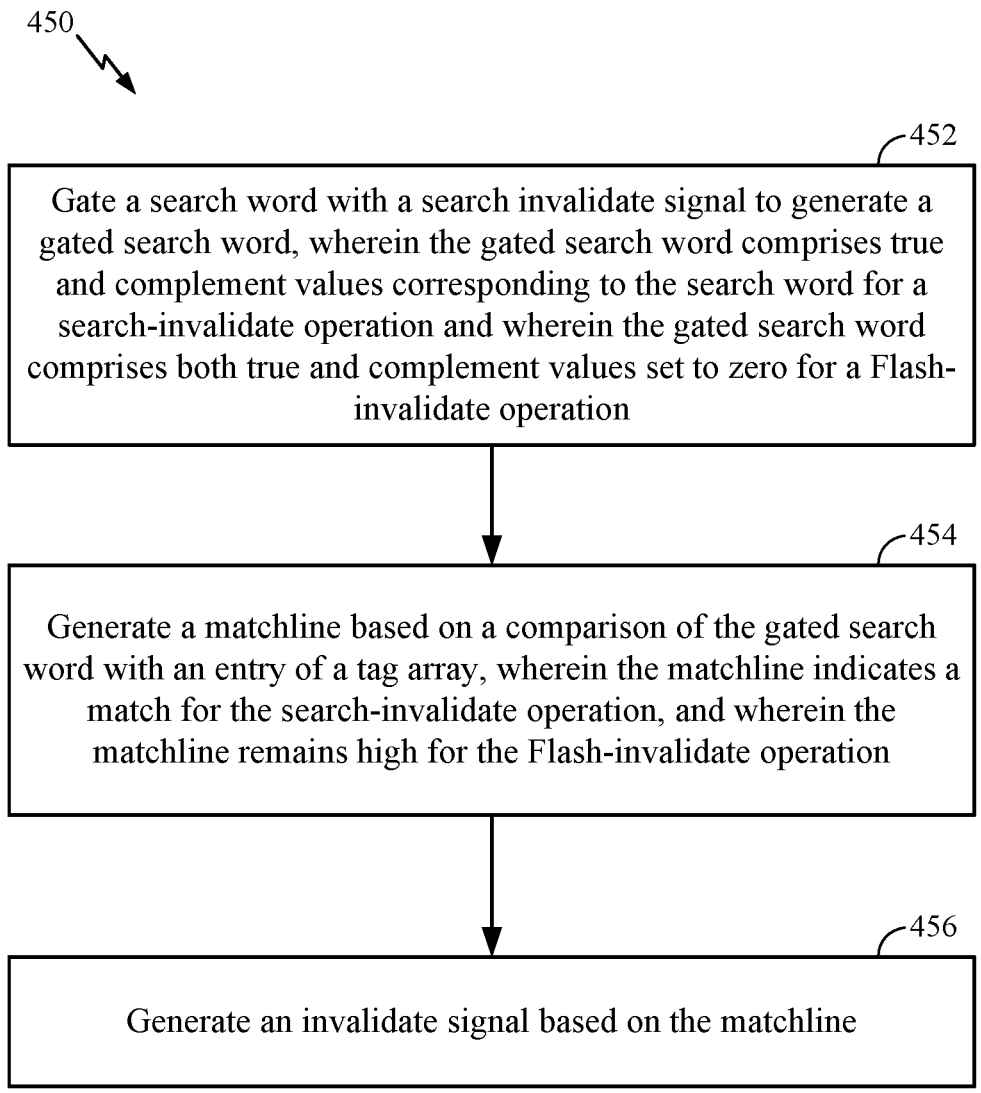

Exemplary aspects include another method (450) illustrated FIG. 4B of invalidating a cache (e.g., cache 300 of FIG. 3B comprising tag array 352 and data array 354).

Block 452 of method 450 comprises gating (e.g., in CGCs 370) a search word (e.g., srch_data 366) with a search-invalidate signal (e.g., srch_inval_clk 368) to generate a gated search word (e.g., srch_data_cgc 364) wherein the gated search word comprises true and complement values corresponding to the search word for a search-invalidate operation and wherein the gated search word comprises both true and complement values set to zero for a Flash-invalidate operation.

Block 454 comprises generating a matchline (e.g., ml 358) based on a comparison of the gated search word with an entry of a tag array (e.g., tag array 352), wherein the matchline indicates a match for the search-invalidate operation, and wherein the matchline remains high for the Flash-invalidate operation (e.g., based on comparison with signal srch_inval_or_flash_clk 360).

Block 456 comprises generating an invalidate signal (e.g., inval_wl 376) based on the matchline.

Figure 5:
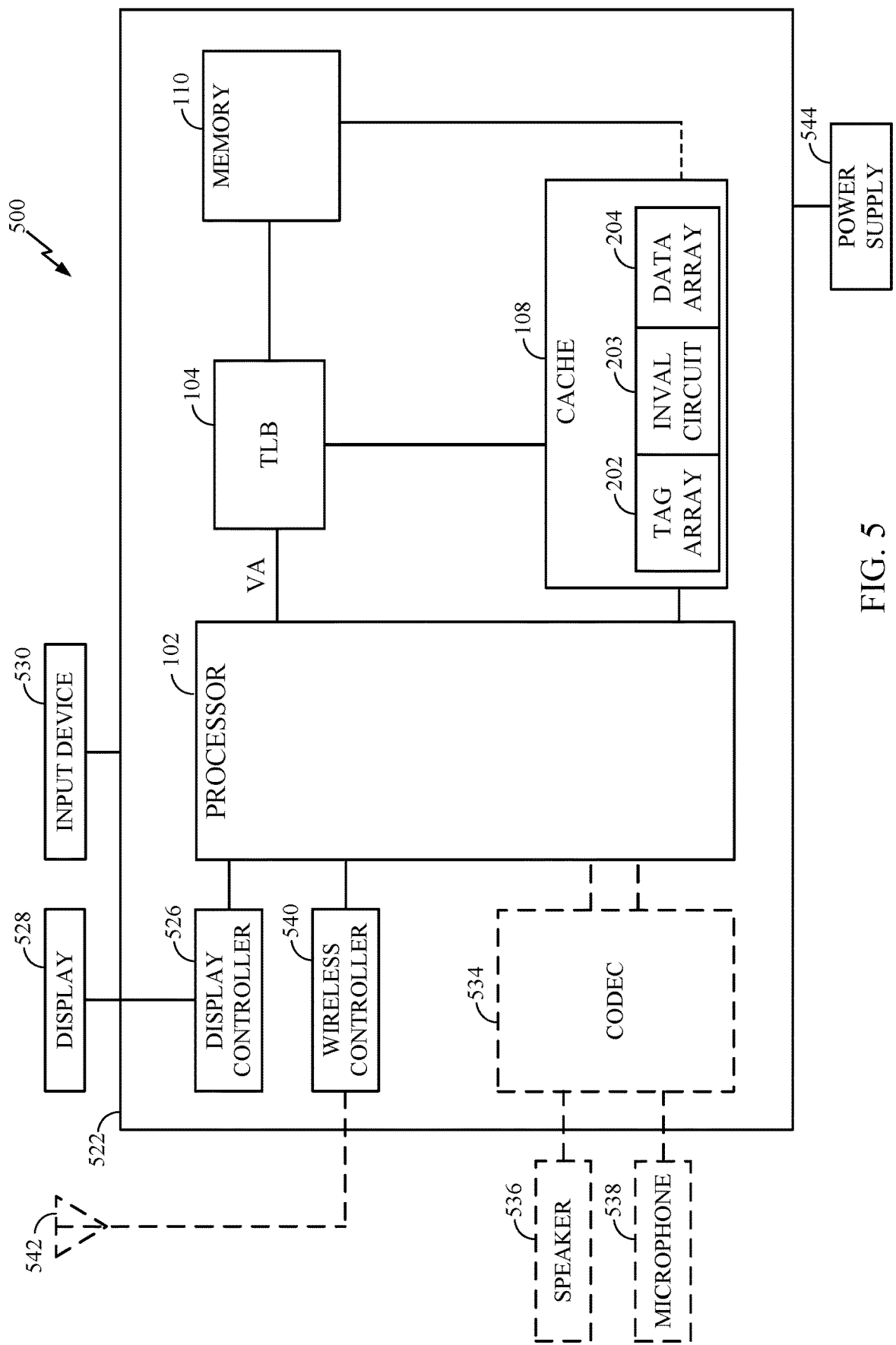
FIG. 5 depicts an exemplary computing device in which an aspect of the disclosure may be advantageously employed.

An example apparatus in which exemplary aspects of this disclosure may be utilized, will now be discussed in relation to FIG. 5. FIG. 5 shows a block diagram of computing device 500. Computing device 500 may correspond to an exemplary implementation of a processing system configured to perform method 400 of FIG. 4. In the depiction of FIG. 5, computing device 500 is shown to include processor 102, TLB 104, cache 108, and memory 110 as discussed with reference to FIG. 1, but it will be understood that other memory configurations known in the art may also be supported by computing device 500. Cache 108 has been representatively illustrated with tag array 202, invalidation circuit 203, and data array 204 as discussed in FIG. 2A, but further details of these blocks have been left out from FIG. 5 for the sake of clarity.

FIG. 5 also shows display controller 526 that is coupled to processor 102 and to display 528. In some cases, computing device 500 may be used for wireless communication and FIG. 5 also shows optional blocks in dashed lines, such as coder/decoder (CODEC) 534 (e.g., an audio and/or voice CODEC) coupled to processor 102 and speaker 536 and microphone 538 can be coupled to CODEC 534; and wireless antenna 542 coupled to wireless controller 540 which is coupled to processor 102. Where one or more of these optional blocks are present, in a particular aspect, processor 102, display controller 526, memory 110, and wireless controller 540 are included in a system-in-package or system-on-chip device 522.

Accordingly, a particular aspect, input device 530 and power supply 544 are coupled to the system-on-chip device 522. Moreover, in a particular aspect, as illustrated in FIG. 5, where one or more optional blocks are present, display 528, input device 530, speaker 536, microphone 538, wireless antenna 542, and power supply 544 are external to the system-on-chip device 522. However, each of display 528, input device 530, speaker 536, microphone 538, wireless antenna 542, and power supply 544 can be coupled to a component of the system-on-chip device 522, such as an interface or a controller.

It should be noted that although FIG. 5 generally depicts a computing device, processor 102 and memory 110, may also be integrated into a set top box, a music player, a video player, an entertainment unit, a navigation device, a personal digital assistant (PDA), a fixed location data unit, a server, a computer, a laptop, a tablet, a communications device, a mobile phone, or other similar devices.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer readable media embodying a method for multi-mode cache invalidation. Accordingly, the invention is not limited to illustrated examples and any means for performing the functionality described herein are included in aspects of the invention.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of cache invalidation, the method comprising:
receiving a matchline signal, wherein the matchline signal indicates whether there is a match between a search word and an entry of a tag array of a cache;
latching the matchline signal in a latch controlled by a latch clock, wherein the latch clock is generated from a single bit mismatch clock for the entry of the tag array, wherein a rising edge of the single bit mismatch clock is based on a delay for determining a single bit mismatch between the search word and the entry of the tag array; and
generating an invalidate signal at an output of the latch, wherein a falling edge of the invalidate signal occurs after a falling edge of the matchline signal.

2. The method of claim 1, further comprising invalidating a cacheline in a data array of the cache based on the invalidate signal, wherein the cacheline is associated with the entry of the tag array.

3. The method of claim 2, wherein invalidating the cacheline comprises setting a valid bit associated with the cacheline to zero.

4. The method of claim 1, wherein the invalidate signal is decoupled from the matchline signal by the latch.

5. The method of claim 1, wherein the latch clock is a delayed and stretched version of the single bit mismatch clock.

6. The method of claim 1, further comprising sampling the matchline signal based on the single bit mismatch clock.

7. A method of invalidating a cache, the method comprising
gating a search word with a search-invalidate signal to generate a gated search word, wherein the gated search word comprises true and complement values corresponding to the search word for a search-invalidate operation and wherein the gated search word comprises both true and complement values set to zero for a Flash-invalidate operation;
generating a matchline based on a comparison of the gated search word with an entry of a tag array, wherein the matchline indicates a match for the search-invalidate operation, and wherein the matchline remains high for the Flash-invalidate operation; and
generating an invalidate signal based on the matchline.

8. The method of claim 7, further comprising invalidating a cacheline of a data array associated with the entry of the tag array based on the invalidate signal.

9. The method of claim 7, wherein the Flash-invalidate operation comprises invalidating all cachelines of the cache.

10. An apparatus comprising:
a cache comprising a tag array and a data array;
an invalidation circuit configured to receive a matchline signal, wherein the matchline signal indicates whether there is a match between a search word and an entry of the tag array;
a latch circuit configured to latch the matchline signal and output an invalidate signal, wherein the latch circuit is controlled by a latch clock, wherein the latch clock is generated from a single bit mismatch clock for the entry of the tag array, wherein a rising edge of the single bit mismatch clock is based on a delay for determining a single bit mismatch between the search word and the entry of the tag array, wherein a falling edge of the invalidate signal occurs after a falling edge of the matchline signal.

11. The apparatus of claim 10, wherein the invalidate signal is configured to invalidate a cacheline in the data array, the cacheline associated with the entry of the tag array.

12. The apparatus of claim 11, wherein the invalidate signal is further configured to set a valid bit associated with the cacheline to zero.

13. The apparatus of claim 10, wherein the latch is configured to decouple the invalidate signal from the matchline signal.

14. The apparatus of claim 10, wherein the latch clock is a delayed and stretched version of the single bit mismatch clock.

15. The apparatus of claim 10, wherein the single bit mismatch clock is configured to sample the matchline signal.

16. The apparatus of claim 10 integrated into a device selected from the group consisting of a set top box, a music player, a video player, an entertainment unit, a navigation device, a personal digital assistant (PDA), a fixed location data unit, a server, a computer, a laptop, a tablet, a communications device, and a mobile phone.

17. An apparatus comprising:
a cache comprising a data array and a tag array;
a clock gating circuit configured to gate a search word with a search-invalidate signal to generate a gated search word, wherein the gated search word comprises true and complement values corresponding to the search word for a search-invalidate operation and wherein the gated search word comprises both true and complement values set to zero for a Flash-invalidate operation;
a matchline generation circuit configured to generate a matchline based on a comparison of the gated search word with an entry of the tag array, wherein the matchline indicates a match for the search-invalidate operation, and wherein the matchline remains high for the Flash-invalidate operation; and
an invalidation circuit configured to generate an invalidate signal based on the matchline.

18. The apparatus of claim 17, wherein the invalidate signal is configured to invalidate a cacheline of the data array, the cacheline associated with the entry of the tag array.

19. The apparatus of claim 17, wherein the Flash-invalidate operation comprises invalidation of all cachelines in the data array of the cache.

20. The apparatus of claim 17 integrated into a device selected from the group consisting of a set top box, a music player, a video player, an entertainment unit, a navigation device, a personal digital assistant (PDA), a fixed location data unit, a server, a computer, a laptop, a tablet, a communications device, and a mobile phone.

* * * * *